United States Patent [19]
Compagne

[11] Patent Number: 5,982,234
[45] Date of Patent: Nov. 9, 1999

[54] LOW NOISE ARRANGEMENT OR AN AMPLIFIER

[75] Inventor: Eric Compagne, Crolles, France

[73] Assignee: Dolphin Integration, Meylan, France

[21] Appl. No.: 08/944,454

[22] Filed: Oct. 6, 1997

[30] Foreign Application Priority Data

Oct. 8, 1996 [FR] France .................................. 96 12412

[51] Int. Cl.[6] ........................................................ H03F 1/26
[52] U.S. Cl. ................................................ 330/149; 330/9
[58] Field of Search ............................... 330/149, 51, 69, 330/109, 9, 252, 11

[56] References Cited

U.S. PATENT DOCUMENTS

| 4,222,012 | 9/1980 | Yokoyama | 330/149 |
|---|---|---|---|
| 4,580,103 | 4/1986 | Tompsett | 330/9 |
| 4,707,667 | 11/1987 | Bertsch | 330/9 |
| 5,365,191 | 11/1994 | Hayashi | 330/252 |
| 5,585,756 | 12/1996 | Wang | 330/9 |
| 5,796,300 | 8/1998 | Morgan | 330/9 |
| 5,796,850 | 8/1998 | Shiono et al. | 330/149 |
| 5,812,023 | 9/1998 | Jones | 330/9 |

FOREIGN PATENT DOCUMENTS 410190364A  7/1998  Japan .

*Primary Examiner*—Robert Pascal
*Assistant Examiner*—Khanh Van Nguyen
*Attorney, Agent, or Firm*—Arthur L. Plevy

[57] ABSTRACT

The invention relates to an arrangement comprising a main amplifier (1, 10) and means (5) for creating, at least during predetermined periods, a floating references voltage ($V_G$) for applying at least one input signal (V') on at least one first input terminal (E−, E) of the main amplifier, said reference voltage ($V_G$) being servo-controlled to the equivalent input noise (Vn) of the main amplifier.

15 Claims, 5 Drawing Sheets

LOW NOISE ARRANGEMENT OR AN AMPLIFIER

FIELD OF THE INVENTION

The present invention relates to a low noise arrangement for an amplifier. The invention generally applies whatever function is associated to the amplifier in the arrangement (amplification, integration, inversion of an input signal, etc.). An application example of the present invention is the realization of a low noise integrating arrangement from a differential amplifier.

DISCUSSION OF THE RELATED ART

FIG. 1 shows a conventional diagram of such an integrating arrangement. This arrangement comprises a differential amplifier 1 having a non-inverting input terminal E+ connected to a median voltage (for example ground) between the supply voltages of the amplifier 1, respectively +Vpol and −Vpol. An inverting input terminal E− of amplifier 1 receives, for example, through a resistor R, an input signal Vin. Voltage Vin is applied between two input terminals 3 and 4 of the arrangement, terminal 4 being grounded. An output of amplifier 1 constitutes an output terminal S of the integrating arrangement. A capacitor C is placed between terminals E− and S.

In FIG. 1, the differential amplifier 1 is modeled by a perfect amplifier 1' having an open loop gain −A, whose inverting input is connected to a voltage generator 2 having a noise Vn. Generator 2 symbolizes the equivalent input noise of amplifier 1.

The quality of the integration realized by the arrangement depends, in particular, on the signal across capacitor C which is a function of the current I flowing through resistor R. If amplifier 1 were perfect, current I would be equal to Vin/R. In reality, amplifier 1 being noisy, the current I also depends on voltage Vn. Moreover, the noise voltage Vn appears to be amplified in the output signal Vs by the voltage gain −A of the amplifier ($V_S=-A(Vin-Vn)$).

Several conventional solutions may be used to reduce the noise of the amplifier.

A known solution consists in increasing the size of the transistors constituting amplifier 1 and the bias current. In addition to the silicon surface increase necessary for realizing the amplifier in integrated circuit form, this solution has the drawback of increasing the spurious capacitances, which causes a speed decrease of the amplifier in responding to a variation of the input signal.

In certain arrangements, resistor R is replaced by a switched capacitor. The input signal Vin is then sampled. The conventional solutions do not allow the noise influence to be minimized while providing an integrator whose speed is sufficient to allow the use of a high sampling frequency of the input signal. To come to a satisfactory solution, the gain of the amplifier is reduced.

More generally, the problem related to noise appears in any arrangement realized from an amplifier, whether it has or not a differential input or output.

FIG. 2 shows an amplifier 10 having a non differential input modeled, like in FIG. 1, by a perfect amplifier 10' associated to a noise voltage generator 2. The difference between the diagrams of FIGS. 1 and 2 resides in that amplifier 10 only has one input E. The voltage $V_T$ here corresponds to the switching voltage of an inverter or to the voltage difference necessary between terminal E and the bias voltage −Vpol for making the amplifier (the transistors present between terminal E and voltage −Vpol) conductive in the case of a simple amplifier. The noise voltage Vn and the DC component $V_T$ are amplified in the output signal $V_S$ by the voltage gain of the amplifier ($V_S=-A(Vin-Vn-V_T)$).

SUMMARY OF THE INVENTION

The present invention aims at providing an integrating arrangement realized from an amplifier, which minimizes the noise influence of the amplifier on the output signal, yet having a high gain.

The invention also aims at providing an arrangement which may operate with low supply voltages and with a low bias current.

The invention also aims at providing an arrangement particularly well adapted to a switched capacitor integrator.

For achieving these objects, the present invention provides an arrangement comprising a main amplifier and means for creating, at least during predetermined periods, a floating reference voltage for applying at least one input signal on at least one first input terminal of the main amplifier, said reference voltage being servo-controlled to the equivalent input noise of the main amplifier.

According to an embodiment of the invention, said means comprises a secondary amplifier having at least one first input terminal directly connected to the first input terminal of the main amplifier and having at least one output terminal defining said reference voltage.

According to an embodiment of the invention, the secondary amplifier has a voltage gain close to and smaller than unity.

According to an embodiment of the invention, said main amplifier has a single input terminal.

According to an embodiment of the invention, the main amplifier is an amplifier having differential inputs, wherein a non inverting input is connected to a median voltage between two supply voltages, respectively most positive and most negative, and an inverting input constitutes said first input terminal of the main amplifier.

According to an embodiment of the invention, said inverting input of the main amplifier being connected, through an impedance, to an output terminal of the main amplifier constituting an output terminal of the arrangement.

According to an embodiment of the invention, the input signal applied to the first input terminal of the main amplifier corresponds to a signal to process applied to a first input terminal of the arrangement.

According to an embodiment of the invention, an input impedance is connected between a first input terminal of the arrangement, receiving a signal to process, and the first input terminal of the main amplifier.

According to an embodiment of the invention, said output terminal of the secondary amplifier constitutes a second terminal for applying the signal to process.

According to an embodiment of the invention, the main amplifier is an amplifier having differential inputs and outputs, each input receiving an input signal; the secondary amplifier has differential inputs and outputs, each output defining a floating voltage for applying one of the input signals; and each input of the main amplifier is connected directly to one input of the secondary amplifier.

According to an embodiment of the invention, the arrangement is an integrator arrangement wherein each input of the main amplifier is connected, through an impedance, to an output terminal of the main amplifier, constituting an output terminal of the arrangement.

According to an embodiment of the invention, two input impedances are respectively connected between terminals of the arrangement receiving a differential signal to process and an input terminal of the main amplifier.

According to an embodiment of the invention, each output terminal of the secondary amplifier constitutes a second terminal for applying the signal to process.

According to an embodiment of the invention, the arrangement comprises switching means operative to periodically disconnect the input impedances from the input terminal of the main amplifier to which it is associated, said input signal of the main amplifier being referenced to said reference voltage during the periods where the impedances are connected.

According to an embodiment of the invention, the main and secondary amplifiers are supplied by identical voltages.

The foregoing and other objects, features, aspects and advantages of the invention will become apparent from the following detailed description of embodiments, given by way of illustration and not of limitation with reference to the accompanying drawings.

BRIEF DESCRIPTION OF THE DRAWINGS

For a sake of clarity, same elements are designated by same referenced characters in the figures.

DESCRIPTION OF THE PREFERRED EMBODIMENTS

Figure 3:
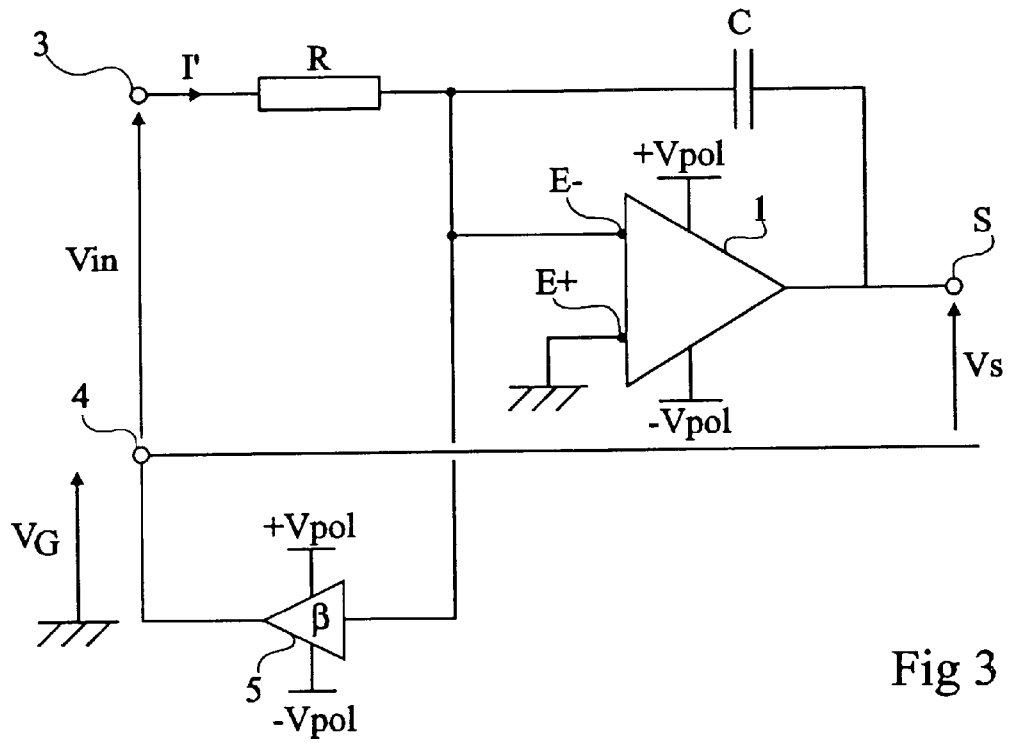
FIG. 3 shows a first embodiment of a low noise arrangement according to the present invention.

FIG. 3 shows a first embodiment of the present invention applied to an integrator arrangement in which an input signal Vin to process is applied through a resistor R. Like previously, the integrator is realized from a differential amplifier 1, similar to that of FIG. 1. An inverting input terminal E− of amplifier 1 is connected to an output terminal S through a capacitor C. Terminal S constitutes the output of the arrangement. A non-inverting terminal E+ of amplifier 1 is connected to a median voltage between two bias voltages +Vpol and −Vpol of amplifier 1.

Voltage +Vpol constitutes the most positive supply voltage and voltage −Vpol constitutes the most negative supply voltage. In the shown example, voltages +Vpol and −Vpol are equal in absolute value (for example 2.5 V) and terminal E+ is connected to ground. However, other values may be selected. For example, +Vpol=3 V and −Vpol=0 V (ground), terminal E+ being connected to a voltage of 1.5 V.

A signal to process Vin is applied between input terminals 3 and 4 of the arrangement. Terminal 3 is connected, through a resistor R, to terminal E−. A feature of this embodiment is that terminal 4 is no longer connected to the same voltage as terminal E+. According to this embodiment, terminal 4 is set at a reference voltage $V_G$ which automatically adapts to the noise of amplifier 1.

More generally, a feature of the present invention is to reference, at least during some periods, the signal applied to the input of the amplifier to a floating voltage $V_G$ depending on the noise of the amplifier.

To achieve this, the arrangement also comprises, according to the invention, a secondary amplifier 5 having an input terminal directly connected to terminal E− of amplifier 1 and an output terminal S' connected to terminal 4. Preferably, the output voltage $V_S$ of the arrangement is also referenced to voltage $V_G$.

According to the invention, the voltage gain β of amplifier 5 is close to but lower than unity. Preferably, amplifier 5 is supplied by the supply voltages +Vpol and −Vpol of amplifier 1.

Figure 4:
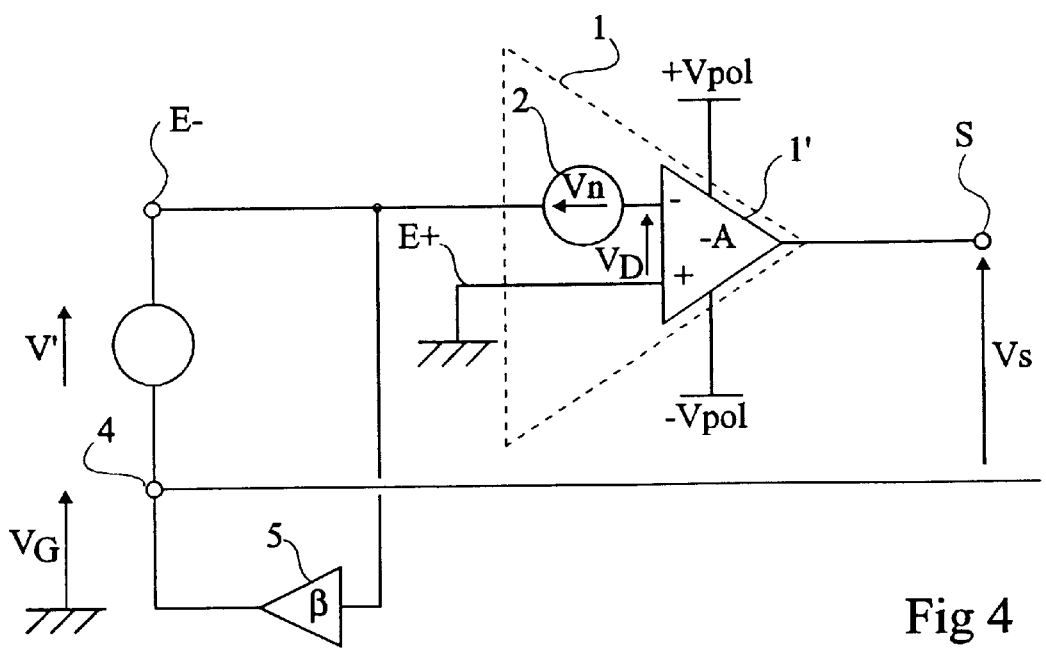
FIG. 4 shows an equivalent diagram of an integrating arrangement according to the present invention.

Amplifier 5 has a double role. First, it increases the open loop gain of the integrating arrangement. Second, it minimizes the noise influence of amplifier 1. These features will be better understood in relation with FIG. 4. FIG. 4 shows a simplified comparator arrangement receiving a signal to process V', directly on input E−. This figure also constitutes a partial representation of the arrangement of FIG. 3, in an open loop configuration and in which the association of voltage Vin and of resistor R is shown in the form of a voltage generator V' connected between terminals E− and 4.

In FIG. 4, amplifier 1 is shown in the schematic form of a perfect amplifier 1' having an open loop gain of −A, associated to a noise generator 2 at its inverting input. The error voltage between the inverting and non inverting inputs of amplifier 1' is designated $V_D$.

The following expressions may be established between voltages V', $V_S$, $V_D$ and $V_G$:

$$V_S + V_G = -A \cdot V_D;$$

$$V' + V_G - Vn = V_D; \text{ and}$$

$$V_G = \beta(Vn + V_D).$$

Bringing $V_G$ in the two first expressions and combining them for eliminating $V_D$, provides:

$$V_S = [(A+\beta)/(\beta-1)]V' + A \cdot Vn.$$

Figure 1:
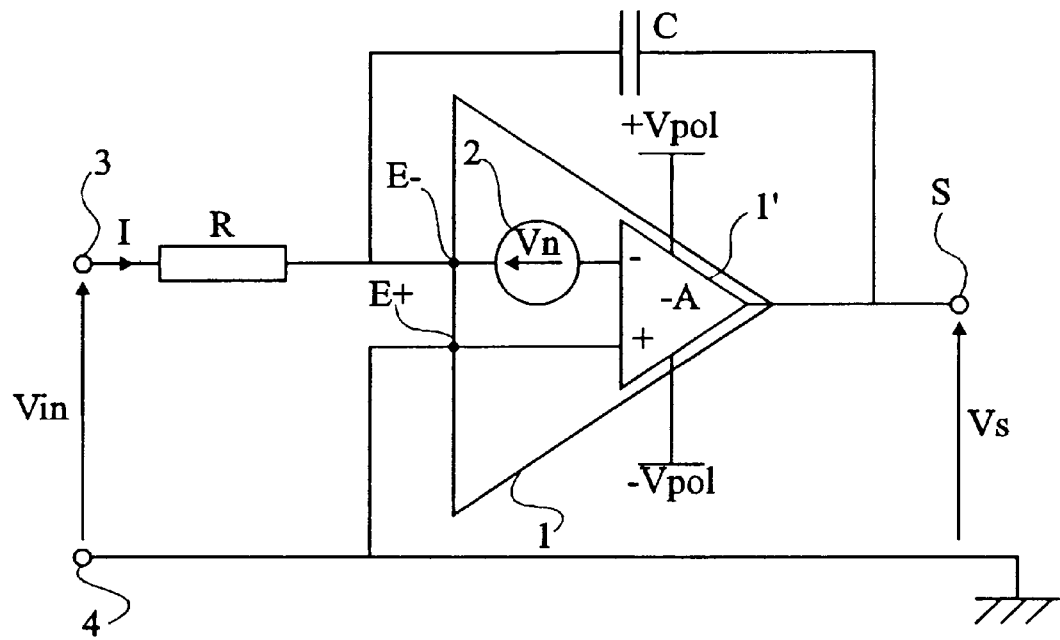
FIGS. 1 and 2, previously described are intended to disclose the state of the art and the related problems.
Figure 2:
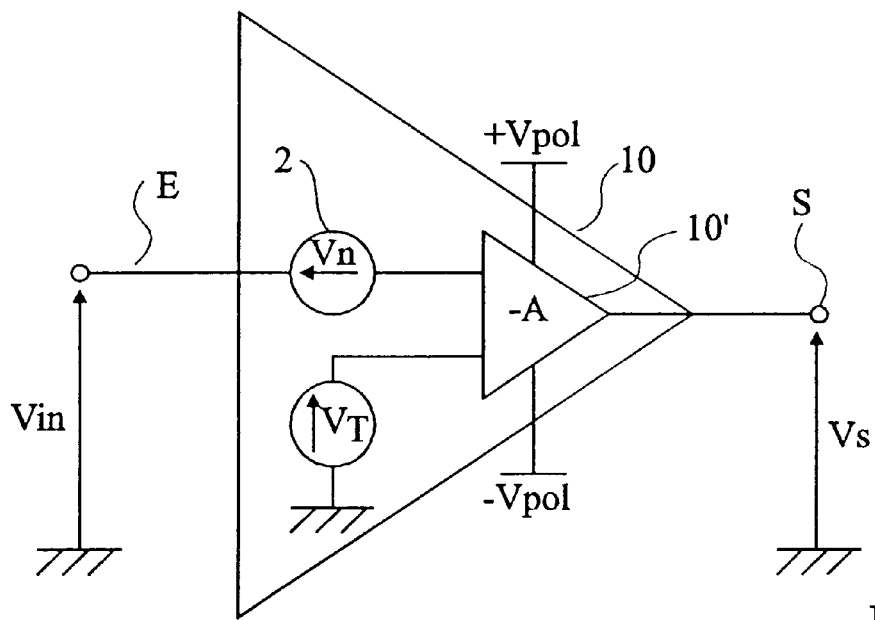

Since the gain β is close to 1, the input signal V' is considerably more amplified than noise Vn whereas, in a conventional arrangement, noise Vn is submitted to the same voltage gain as the useful signal V'. Indeed, a conventional arrangement such as shown in FIG. 1 would provide $$V_S = -A(V' - Vn).$$

An advantage of the present invention is that the equivalent noise between the input terminals E− and 4 is attenuated by a factor β−1. Thus, the equivalent input noise of the arrangement decreases when the gain of secondary amplifier 5 gets closer to 1. Therefore, the influence of noise Vn on the current I' flowing through resistor R (FIG. 3), thus on the signal across capacitor C, is minimized. The quality of the integration is thus increased.

It should be remarked that the gain β of amplifier 5 must be below unity. Indeed, if this gain is greater than 1, the arrangement of FIG. 3 becomes unstable, because amplifier 5 is then in a loop with resistor R and the input voltage Vin.

As a particular example, the gain of amplifier 5 is comprised between 0.9 and 0.99.

An advantage of the present invention is that, for a given voltage gain of the arrangement, amplifier 1 may be realized with a smaller intrinsic gain than in a conventional arrangement. Indeed, the gain of amplifier 1 is divided by a factor β−1 close to 0. It is thus possible to reduce the number of stages of amplifier 1 with respect to a conventional arrangement. The number of cascaded transistor stages constituting amplifier 1 may thus be minimized while still obtaining a high open loop gain for the arrangement. In addition to minimizing noise Vn which depends on the number of transistors of the amplifier, this reduces the minimum supply voltage necessary for the operation of the arrangement. A low noise amplifier supplied at a low voltage, for example about 3 V, may thus be realized.

Another advantage of the present invention is that, since the intrinsic gain of the amplifier is reduced, one may, for given noise characteristics, use noisier transistors for realizing amplifier 1, which reduces the cost of the arrangement.

Figure 5:
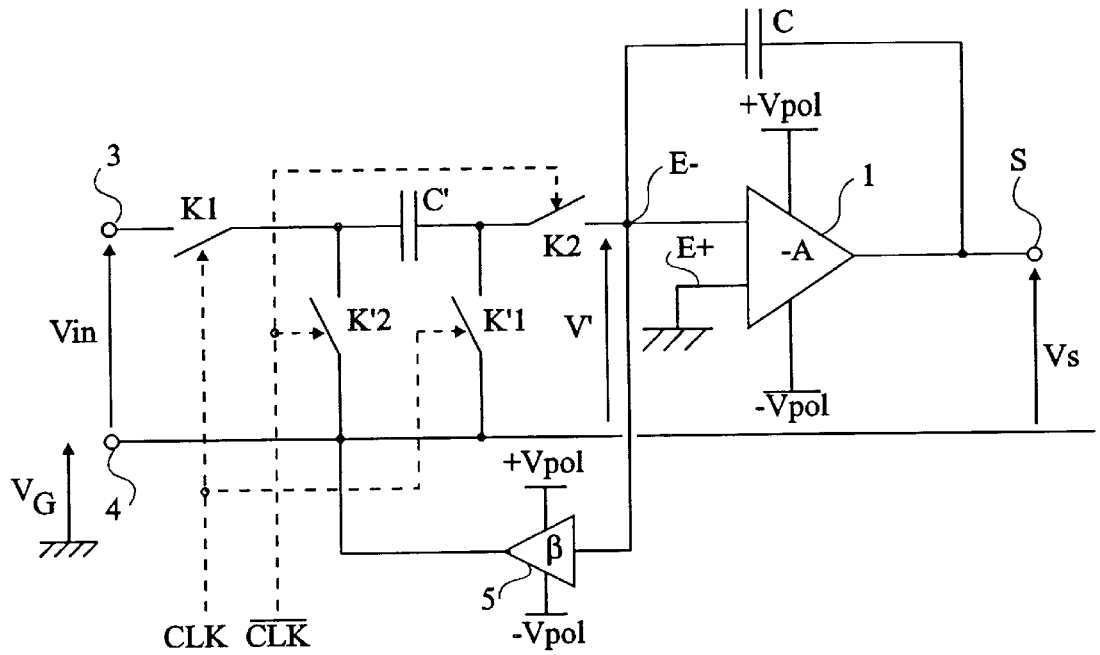
FIG. 5 shows a first embodiment of a switched capacitor integrating arrangement according to the present invention.

FIG. 5 shows an embodiment of an integrating arrangement according to the present invention, in which resistor R (FIG. 3) is replaced by a switched capacitor arrangement.

In such an arrangement, a first switch K1 is connected in series with a capacitor C' and a second switch K2 is connected between terminals 3 and E−. Each terminal of capacitor C' is additionally connected to terminal 4 through a switch, respectively K'1 and K'2. The rest of the arrangement is similar to the arrangement described in relation with FIG. 3. Switches K1 and K'1 and switches K2 and K'2 are closed alternately. For example, switches K1 and K'1 are controlled by a clock signal CLK while switches K2 and K'2 are controlled by a signal $\overline{CLK}$ corresponding to the complement of signal CLK. The voltage V' at input E− of the amplifier 10, referenced to voltage $V_G$, is present during the periods where switches K2 and K'2 are closed.

Figure 6:
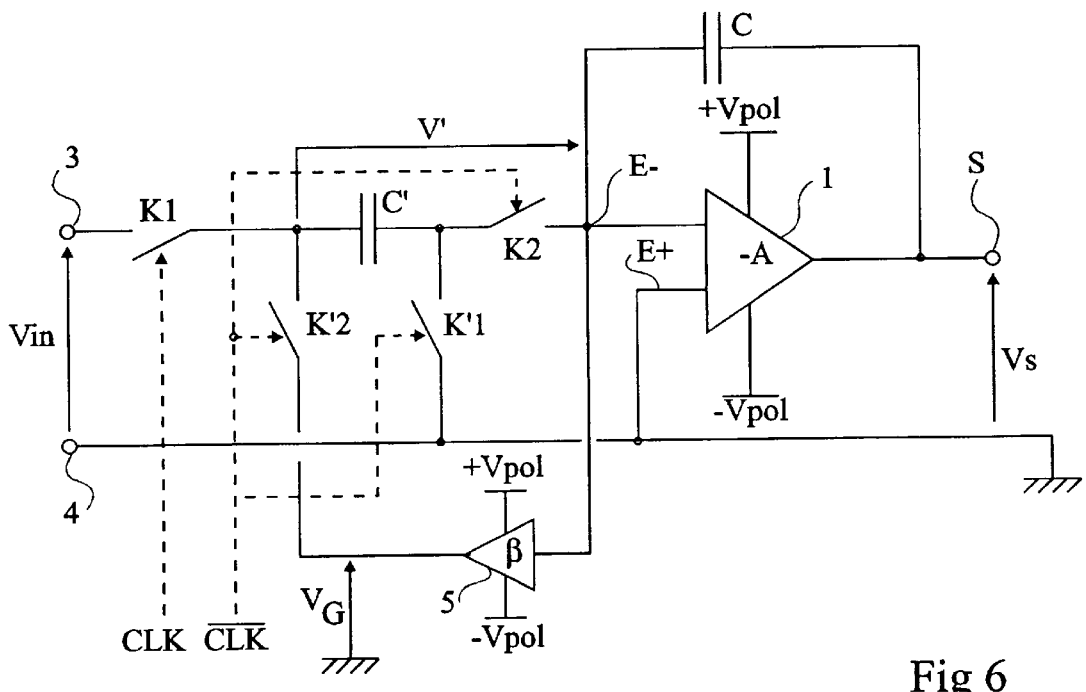
FIG. 6 shows a second embodiment of a switched capacitor integrator arrangement according to the invention.

FIG. 6 shows a second embodiment of an integrating arrangement according to the invention. A difference with respect to the arrangements of FIGS. 3 to 5 is that the signal to process Vin is referenced to ground. Voltage V' applied to the input E− of amplifier 1 is however still referenced to voltage $V_G$ set by the secondary amplifier. Indeed, voltage V' on input E− is present only during the periods where switches K2 and K'2 are closed. Terminal E− is isolated from voltage Vin referenced to ground, either by switch K1 or by capacitor C'.

By means of an arrangement according to the invention, the antagonist compromise noise-gain-speed is satisfied because the speed is insured by the main amplifier 1 while the noise influence is minimized by the secondary amplifier 5, the gain being insured by the two amplifiers together (≈A/β−1).

Amplifier 5 is particularly simple to realize because it only needs few components and because its input and output voltages have very low amplitudes (of about several millivolts) The noise of the arrangement now depends on secondary amplifier 5. This noise is very low because this amplifier 5 has very few components.

Figure 7:
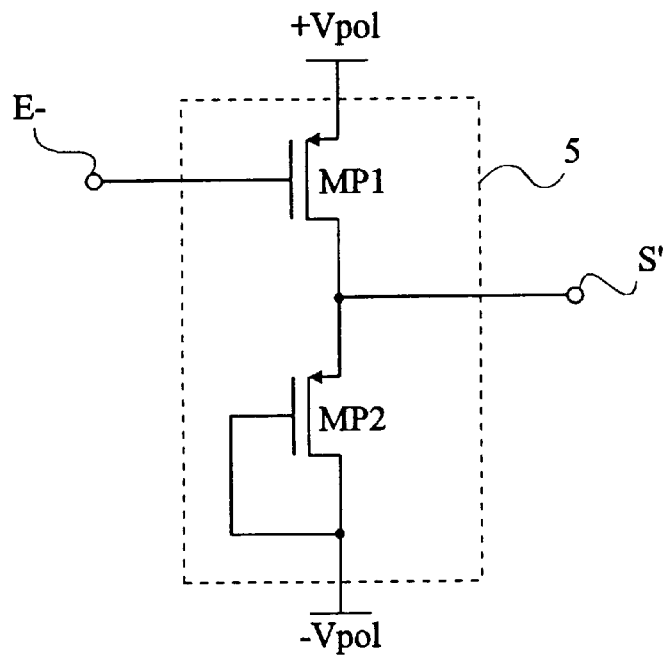
FIG. 7 shows an embodiment of a secondary amplifier of a low noise arrangement according the present invention.

FIG. 7 shows an embodiment of a secondary non differential amplifier 5 according to the invention. Amplifier 5 is comprised of two P-MOS transistors MP1 and MP2, connected in series between the bias voltages +Vpol and −Vpol. The source of transistor MP1 is connected to voltage +Vpol. Its drain constitutes the output terminal S'. The gate of transistor MP1 constitutes the input terminal connected to terminal E−. The source of transistor MP2 is connected to the drain of transistor MP1. The gate of transistor MP2 is connected to its drain, in turn connected to voltage −Vpol. The gain β of amplifier 5 is set by the following expression:

$$\beta = gm1(rds1//1/gm2) = gm1/[(1/rds1)+gm2],$$

where gm1 and gm2 are the respective transconductance gains of transistors MP1 and MP2, and where rds1 is the drain-source on resistance of transistor MP1.

Since the inverse of the transconductance of a MOS transistor is generally substantially smaller than its drain-source resistance, the gain β is close to 1 if transistors MP1 and MP2 are identical. Moreover, gain β is then always smaller than 1, the numerator of the expression being always smaller than the denominator.

Figure 8:
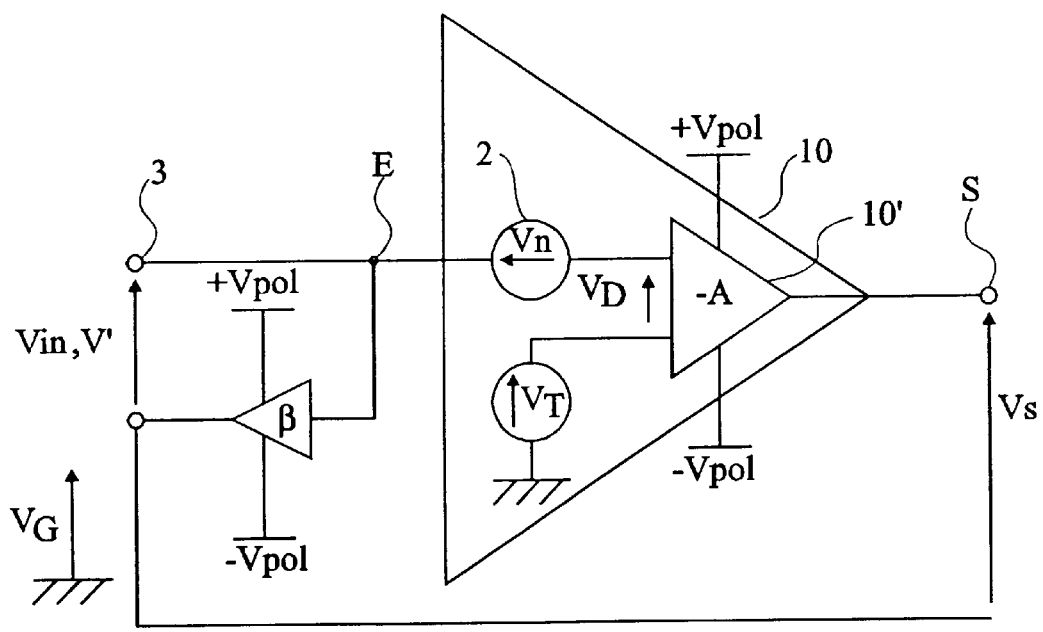
FIG. 8 shows a third embodiment of a low noise arrangement according to the present invention.

FIG. 8 shows an embodiment of the present invention applied to an amplifier 10 with a single input (non differential). The input terminal E of amplifier 10 is connected, through a secondary amplifier 5 such as previously described, to terminal 4 which is now not connected to ground. The signal to process Vin (corresponding here to V') is applied between terminals 3 and 4, terminal 4 being at the floating voltage $V_G$. The expressions described previously in relation with FIG. 4 apply to this arrangement by taking into account the DC switching (or conduction) threshold $V_T$ of amplifier 10. The following expression is thus obtained:

$$V_S = [(A+\beta)/(\beta-1)]V' + A(Vn+V_T)$$

If the arrangement of FIG. 8 is used, for example, as an inverter whose switching threshold is centered between +Vpol and −Vpol, then $V_T$=0. If the arrangement of FIG. 8 is used, for example, as a simple amplifier of signal V', voltage $V_T$ corresponds to the conduction threshold of the amplifier, for example, the threshold voltage of a MOS transistor whose gate constitutes terminal E, whose drain constitutes terminal S connected through a current source to voltage +Vpol, and whose source is at voltage −Vpol. It should be remarked that terminal E may, also in this case, be connected to terminal 3 by an input impedance.

Figure 9:
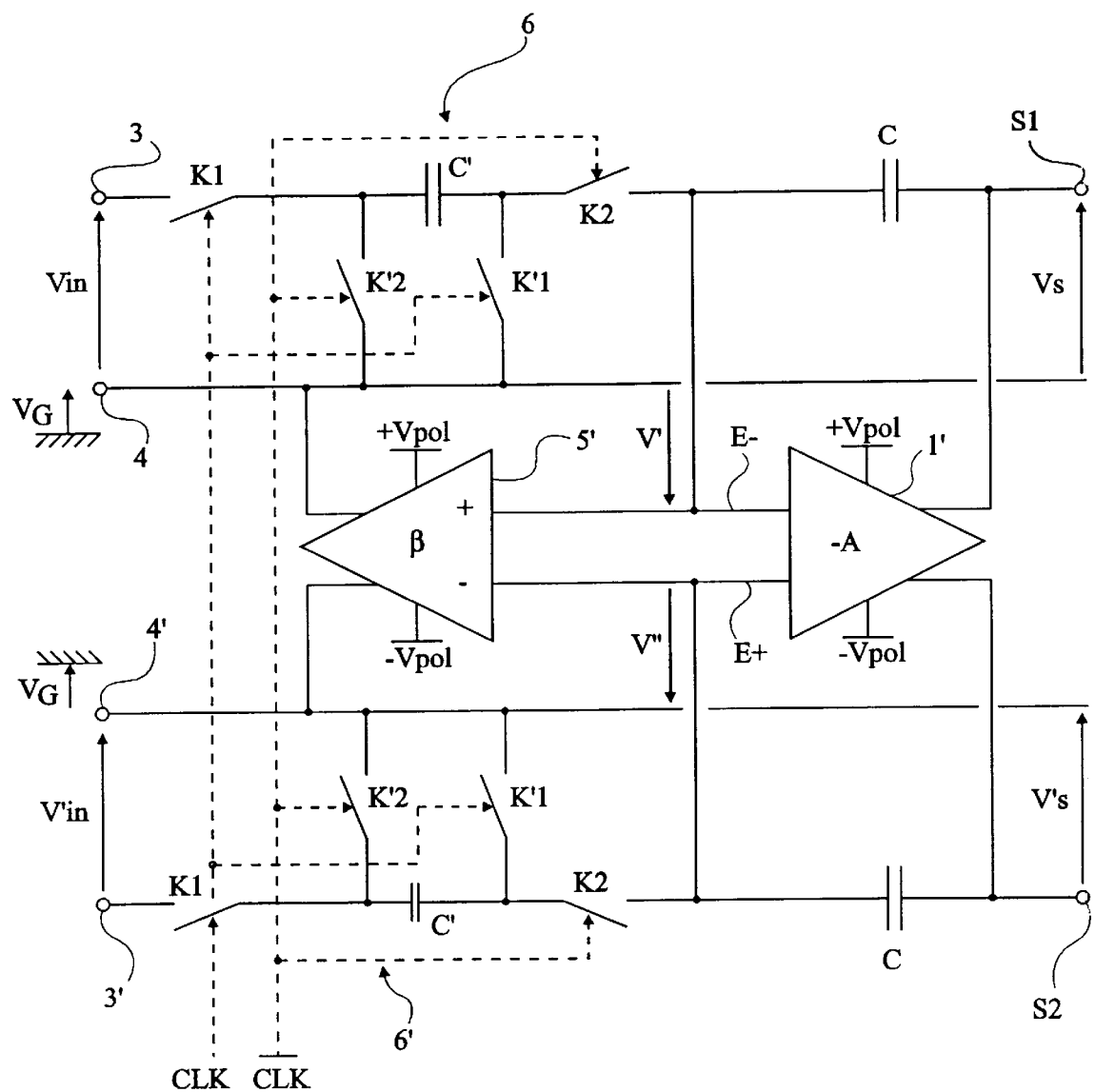
FIG. 9 shows an embodiment of a switched capacitor differential integrator arrangement according to the present invention.

FIG. 9 shows an embodiment of an entirely differential arrangement according to the invention. The example shown in FIG. 9 is a switched capacitor integrator arrangement of the type shown in FIG. 5.

The main amplifier 1' of FIG. 9 comprises two differential outputs S1, S2 and each output is connected to one input, respectively, E−, E+, through a capacitor C. The arrangement comprises two terminals 3, 3' for applying the signal to process. This signal is, because of the differential structure, decoupled in a conventional manner into two signals Vin, V'in respectively applied to terminals 3 and 3'. It is however the same signal. Each input E−, E+ of amplifier 1' is associated to a switched capacitor arrangement 6, 6'. Each arrangement comprises, like in FIG. 5, a switch K1 in series with a capacitor C' and a switch K2, between terminals 3 and E−, respectively 3' and E+.

According to the present invention, each input E−, E+ of amplifier 1' is also connected to one input, respectively non inverting (+) and inverting (−), of a secondary amplifier 5' having differential outputs. Each output of amplifier 5' is connected to one terminal 4, 4' for applying the voltage, respectively Vin, V'in, of the signal to process. Thus, amplifier 5' defines, on the two terminals 4, 4'a reference voltage $V_G$ which is servo-controlled to the equivalent input noise of amplifier 1', and the voltages V', V" applied to inputs E−, E+ of amplifier 1' are always referenced to voltage $V_G$.

The operation of the arrangement shown in FIG. 9 is deduced from that explained in relation with FIG. 5. It will be noted that the floating reference voltage $V_G$ has the same value on terminals 4 and 4', the arrangement being perfectly symmetrical.

It will also be noted that an integrator arrangement such as shown in FIG. 3 or in FIG. 6 may also be adapted to an entirely differential arrangement in a similar manner, each differential arrangement being dividable in two symmetrical portions respectively associated to the positive and negative voltages.

It will moreover be noted that the implementation of the invention does not need any modification of the output stage, whether the arrangement is based on a single or differential output amplifier. Indeed, the invention only involves the input stage.

Of course, various alternatives and modifications of the present invention will appear to those skilled in the art. In particular, the selection of the supply voltages +Vpol and −Vpol of the amplifiers of the arrangement depend on the particular application for which the integrator is intended. Moreover, the practical realization of the main amplifier 1 makes use of conventional techniques which are available to those skilled in the art, and, in case the arrangement comprises an input impedance, it may be a resistive, capacitive, or inductive element, or a combination of elements of these types.

Such alterations, modifications, and improvements are intended to be within the spirit and scope of the invention. Accordingly, the foregoing description is by way of example only and is not intended to be limiting. The invention is limited only as defined in the following claims and the equivalents thereto.

I claim:

1. An arrangement comprising a main amplifier (1, 1', 10) and means (5, 5') for creating, at least during predetermined periods, a floating reference voltage ($V_G$) for applying at least one input signal (V') on at least one first input terminal (E−, E) of the main amplifier, said reference voltage ($V_G$) being servo-controlled to an equivalent input noise (Vn) of the main amplifier;

wherein said means comprises a secondary amplifier (5, 5') including at least one input terminal directly connected to said at least one input terminal (E−, E) of the main amplifier (1, 1', 10) and at least one output terminal (S') defining said reference voltage ($V_G$).

2. The arrangement of claim 1, wherein the secondary amplifier (5, 5') has a voltage gain (β) close to and smaller than unity.

3. The arrangement of claim 1, wherein said main amplifier (10) has a single input terminal (E).

4. The arrangement of claim 1, wherein the main amplifier is an amplifier (1) having differential inputs (E−, E+), wherein a non inverting input (E+) is connected to a median voltage between two supply voltages, respectively most positive (+Vpol) and most negative (−Vpol), and an inverting input (E−) constitutes said first input terminal of the main amplifier (1).

5. The arrangement of claim 4, constituting an integrating arrangement, said inverting input (E−) of the main amplifier (1) being connected, through an impedance (C), to an output terminal (S) of the main amplifier constituting an output terminal of the arrangement.

6. The arrangement of claim 1, wherein the input signal applied to the first input terminal (E−, E) of the main amplifier (1, 10) corresponds to a signal (V') to process applied to a first input terminal 3 of the arrangement.

7. The arrangement of claim 1, wherein an input impedance (R, C') is connected between a first input terminal (3) of the arrangement, receiving a signal (Vin) to process, and the first input terminal (E−) of the main amplifier (1).

8. The arrangement according to claim 1, wherein said output terminal (S') of the secondary amplifier (5) constitutes a second terminal (4) for applying the signal to process (Vin, V').

9. The arrangement according to claim 1, wherein:

the main amplifier is an amplifier (1') having differential inputs (E−, E+) and outputs (S1, S2), each input (E−, E+) receiving an input signal (V', V");

the secondary amplifier (5') has differential inputs and outputs, each output defining a floating voltage for applying one of the input signals; and each input of the main amplifier is connected directly to one input of the secondary amplifier.

10. The arrangement according to claim 9, forming an integrator arrangement wherein each input (E−, E+) of the main amplifier (5') is connected, through an impedance (C), to an output terminal (S1, S2) of the main amplifier, constituting an output terminal of the arrangement.

11. The arrangement according to claim 9, wherein two input impedances (C') are respectively connected between terminals (3, 3') of the arrangement receiving a differential signal (Vin, V'in) to process and an input terminal (E−, E+) of the main amplifier.

12. The arrangement according to claim 1, wherein each output terminal of the secondary amplifier (5') constitutes a second terminal (4, 4') for applying the signal to process (Vin, V'in).

13. The arrangement according to claim 7 or 11, comprising switching means (K1, K2, K'1, K'2) operative to periodically disconnect the input impedances (C') from the input terminal (E−, E+) of the main amplifier (1, 1') to which it is associated, said input signal (V', V") of the main amplifier being referenced to said reference voltage ($V_G$) during the periods where the impedances (C') are connected.

14. The arrangement according to claim 2, wherein the main (1, 1', 10) and secondary (5') amplifiers are supplied by identical voltages (+Vpol, −Vpol).

15. A circuit comprising:

first and second amplifiers each including at least one input terminal and an output terminal, wherein said at least one input terminal of said second amplifier is directly coupled to said at least one input terminal of said first amplifier, and said output terminal of said second amplifier defines a reference voltage for at least one signal applied to said at least one input terminal of said first amplifier; and, wherein said reference voltage is servo-controlled to an equivalent input noise of the first amplifier.

* * * * *